(12) United States Patent
Lam et al.

(10) Patent No.: US 11,056,377 B2
(45) Date of Patent: Jul. 6, 2021

(54) COLLET INSPECTION IN A SEMICONDUCTOR PICK AND PLACE APPARATUS

(71) Applicant: ASM Technology Singapore Pte Ltd, Singapore (SG)

(72) Inventors: Kui Kam Lam, Hong Kong (HK); Kai Siu Lam, Hong Kong (HK); Cheuk Ki Tam, Hong Kong (HK); Nim Tak Wong, Hong Kong (HK); Ka Yee Mak, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/459,797

(22) Filed: Jul. 2, 2019

(65) Prior Publication Data
US 2021/0005498 A1    Jan. 7, 2021

(51) Int. Cl.
| | |
|---|---|
| *H01L 21/683* | (2006.01) |
| *B25J 15/06* | (2006.01) |
| *B65G 47/91* | (2006.01) |
| *H01L 21/677* | (2006.01) |

(52) U.S. Cl.
CPC ...... *H01L 21/6838* (2013.01); *B25J 15/0616* (2013.01); *B65G 47/91* (2013.01); *H01L 21/677* (2013.01)

(58) Field of Classification Search
CPC .... B25J 15/0616; B25J 19/023; B25J 13/088; B25J 13/089; H01L 21/6838; H01L 21/68; H01L 21/681; B65G 47/91; G05B 2219/39557

USPC ......................................................... 700/259
See application file for complete search history.

(56) References Cited

U.S. PATENT DOCUMENTS

| | | | | |
|---|---|---|---|---|
| 5,290,081 A | * | 3/1994 | Ogura | H01L 24/75 294/185 |
| 5,590,456 A | * | 1/1997 | Armington | G02B 6/4221 29/721 |
| 6,311,391 B1 | * | 11/2001 | Fuke | H01L 21/67144 228/105 |
| 6,389,688 B1 | * | 5/2002 | Srivastava | H01L 21/681 29/833 |
| 7,184,909 B2 | * | 2/2007 | Bolliger | H01L 21/681 702/95 |
| 9,523,570 B2 | * | 12/2016 | Regan | B25J 15/0616 |
| 2002/0060464 A1 | * | 5/2002 | Bendat | H05K 13/0812 294/185 |
| 2004/0061346 A1 | * | 4/2004 | Capewell | H01L 21/681 294/185 |
| 2013/0249228 A1 | * | 9/2013 | Lai | H01L 21/6838 294/185 |
| 2016/0082711 A1 | * | 3/2016 | Barwicz | C09J 5/00 156/273.7 |

* cited by examiner

*Primary Examiner* — Gerald McClain
(74) *Attorney, Agent, or Firm* — Ostrolenk Faber LLP

(57) ABSTRACT

A semiconductor pick and place apparatus comprises: a pick arm having a main body, and a conduit incorporated in the main body for permitting fluid flow through the main body via the conduit, the conduit further defining a holding orifice which is operative in use to secure a semiconductor die, the conduit being configured to convey light received from one side of the pick arm through the holding orifice and an alignment window located on the main body to an opposite side of the pick arm.

19 Claims, 4 Drawing Sheets

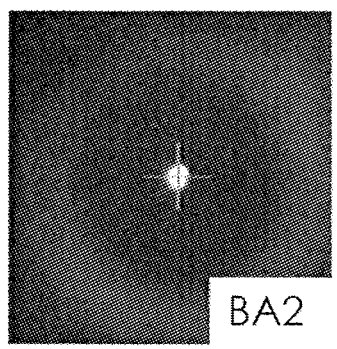 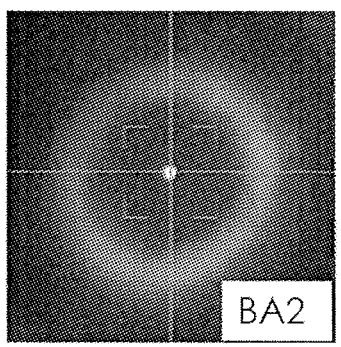 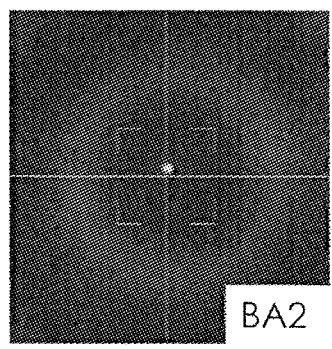
FIG. 4A  FIG. 4B  FIG. 4C

COLLET INSPECTION IN A SEMICONDUCTOR PICK AND PLACE APPARATUS

FIELD OF THE INVENTION

The invention relates to an apparatus and method for picking and placing semiconductors, such as for die sorting or die bonding applications.

BACKGROUND

A pick and place apparatus is used to pick up an object from a first station and thereafter to place or release the object at a second station. Pick and place devices are typically used in various semiconductor manufacturing processes, such as die bonding and die sorting.

After a semiconductor wafer has been fabricated, the semiconductor wafer is usually mounted onto an adhesive film such as Mylar film, and subsequently singulated into individual semiconductor dice. The semiconductor dice may be tested either before or after singulation, in order to generate information for completing a wafer map containing characteristics of each semiconductor die together with its position in the wafer. The semiconductor dice may then be sorted based on the wafer map generated. A die sorting process may involve sorting good dice from defective dice, or sorting dice such as light-emitting diodes (LEDs) according to their electrical properties, light intensity, and frequency.

A pick and place apparatus may be used to sort the semiconductor dice. A pick arm comprising a pick head or body is used to pick up a semiconductor die and transfer it to an appropriate bin. The die sorting process generally requires the pick head to be accurately positioned with respect to the semiconductor die to be picked up, or the location or bin where the semiconductor die is to be placed.

During a die bonding process, a semiconductor die is mounted onto a substrate. The substrate is transported to a dispensing station where adhesive is applied onto bonding locations on the substrate, and thereafter the substrate is moved to a bonding station. At the bonding station, a semiconductor wafer comprising separated semiconductor dice adhering to an adhesive film clamped in a frame are provided on a wafer table. A pick and place apparatus picks up each semiconductor die and places it onto a respective bonding location on the substrate. The picking and removal of the semiconductor dice from the adhesive film and the placing of the semiconductor dice onto the substrate, are processes that require high precision, especially as sizes of semiconductor dice and their bonding locations become smaller with technological advancements.

However, some problems may be encountered when operating pick and place apparatus for extended periods.

It would be beneficial to provide an improved pick and place apparatus which is able to operate more accurately for extended periods as compared to the prior art.

SUMMARY OF THE INVENTION

It is thus an object of this invention to seek to provide a pick and place apparatus which overcomes at least some of the aforementioned problems of the prior art.

According to a first aspect of the present invention, there is provided a semiconductor pick and place apparatus, comprising: a pick arm having a main body, and a conduit incorporated in the main body for permitting fluid flow through the main body via the conduit, the conduit further defining a holding orifice which is operative in use to secure a semiconductor die, the conduit being configured to convey light received from one side of the pick arm through the holding orifice and an alignment window located on the main body to an opposite side of the pick arm.

The first aspect recognizes that pick and place apparatus are often operated for long periods of time at high transfer speeds, which may cause mechanical parts in the pick arm to expand due to the heat generated. The thermal expansion of the pick arm would cause its holding orifice to shift from its original position such that its position is no longer accurate or at the intended location, thus resulting in errors during pick and place operations. Accordingly, a pick and place apparatus is provided. The pick and place apparatus may be for manipulating semiconductor dice. The apparatus may comprise a pick arm. The pick arm may have a main body or component. The main body may define a conduit. The conduit may be located within the main body. The conduit may be configured to support a fluid flow through the main body using the conduit. The conduit may define a holding or vacuum orifice which may be used to secure or hold a semiconductor die. The conduit may be arranged to convey, propagate or transfer light which is received through the holding orifice on one side of the pick arm to an alignment window located on the main body on an opposite side of the pick arm. In this way, light can be used to illuminate the position of the holding orifice so that its location can be determined and corrected if necessary during the operation of the pick and place apparatus.

In one embodiment, the holding orifice and the alignment window are optically aligned. In one embodiment, the holding orifice and the alignment window are co-axially aligned. Accordingly, the holding orifice and the alignment window may be aligned to allow the passage of light from the holding orifice to the alignment window through the conduit.

In one embodiment, the holding orifice and the alignment window are concentric.

In one embodiment, the holding orifice is open to fluidly couple the conduit with an ambient atmosphere via the holding orifice. Accordingly, the holding orifice may fluidly couple the conduit with ambient atmosphere to allow the passage of ambient atmosphere into the conduit in order to generate a reduced pressure to secure the semiconductor die to the holding orifice.

In one embodiment, the alignment window houses an optical assembly configured to project light received through the holding orifice onto an imaging device positioned on the said opposite side of the pick arm. Accordingly, an optical assembly may be provided which directs light received by the optical assembly from the holding orifice via the conduit and on to an imaging device. This enables the imaging device to image the illuminated holding orifice.

In one embodiment, the optical assembly seals the conduit at the optical assembly to prevent fluid communication between the ambient atmosphere and the conduit via the optical assembly. Sealing with the optical assembly improves the effectiveness of securing the semiconductor die to the holding orifice.

In one embodiment, the main body of the pick arm is elongate, having a major elongate axis, and a line passing through the alignment window and the holding orifice extends through the pick arm in a direction transverse to the major elongate axis. Hence, the main body may have a major axis extending along the elongate length of the main body.

The alignment window and holding orifice may be aligned in a direction which is transverse to the major elongate axis.

In one embodiment, the conduit further comprises a through-hole at the holding orifice extending through the pick arm. In other words, the conduit is unobstructed to facilitate the passing of light therethrough.

In one embodiment, the holding orifice is positioned on a first face of the pick arm proximate the semiconductor die, and the alignment window is positioned on an opposing second face of the pick arm. Accordingly, the holding orifice and the alignment windows may be located on opposite sides of the pick arm.

In one embodiment, the conduit comprises a frusto-conical collet extending from the main body in the direction transverse to the major elongate axis, a minor annulus of the frusto-conical portion defining the holding orifice for exerting a vacuum suction force on the semiconductor die. Accordingly, the holding orifice may be defined by a collet provided on the main body.

In one embodiment, the conduit defines a vacuum passage which fluidly couples the conduit with a vacuum device. Accordingly, a vacuum passage may be provided which enables a vacuum device to cause fluid flow into the conduit to generate the suction force on the semiconductor die at the holding orifice.

In one embodiment, the vacuum passage extends from a position intermediate the holding orifice and the alignment window. Accordingly, the vacuum passage may be fluidly coupled with the conduit at a location along the conduit which is between the holding orifice and the alignment window.

In one embodiment, the conduit is at least partially embedded within the pick arm.

In one embodiment, the apparatus comprises a light source which is positioned to transmit light through a surface on which the semiconductor die is configured to be mounted, towards the holding orifice. Accordingly, a light source may be provided which transmits light towards the holding orifice. This provides for illumination of the orifice from the vicinity of the semiconductor die which is imaged by the imaging device.

In one embodiment, at least one of the main body and the frusto-conical collet is dimensioned to extend along said major elongate axis such as to impair light transmission from the light source to the imaging device other than via the holding orifice. This helps to shield light other than light passing through the holding orifice from being received by the imaging device.

In one embodiment, the light source is positioned to illuminate an ejector body operable to lift the semiconductor die. Hence, an ejector body may be illuminated which in turn illuminates the holding orifice.

In one embodiment, the light source is at least one of optically and co-axially aligned with the holding orifice and the alignment window.

In one embodiment, the conduit is unobstructed to facilitate light being conveyed from the holding orifice to the alignment window.

In one embodiment, the vacuum conduit at least partially extends along the major elongate axis.

In one embodiment, the apparatus comprises comprising the imaging device.

In one embodiment, the imaging device comprises a camera.

In one embodiment, the apparatus comprises the light source.

In one embodiment, the apparatus comprises the vacuum device.

According to a second aspect of the present invention, there is provided a semiconductor pick and place method, comprising: providing a pick arm having a main body, and a conduit incorporated in the main body for permitting fluid flow through the main body via the conduit, the conduit further defining a holding orifice which is operative in use to secure a semiconductor die; and conveying light received from one side of the pick arm, through the holding orifice and an alignment window located on the main body to an opposite side of the pick arm.

In one embodiment, the method comprises at least one of optically and co-axially aligning the holding orifice and the alignment window.

In one embodiment, the method comprises concentrically aligning the holding orifice and the alignment window.

In one embodiment, the method comprises fluidly coupling the conduit with an ambient atmosphere via the holding orifice.

In one embodiment, the method comprises projecting light received through the holding orifice onto an imaging device positioned on the said opposite side of the pick arm with an optical assembly housed by the alignment window.

In one embodiment, the method comprises determining a position of the holding orifice with respect to the semiconductor die from the light received by the imaging device.

In one embodiment, the method comprises spatially offsetting the semiconductor die with respect to the pick arm to align the holding orifice with the semiconductor die.

In one embodiment, the method comprises determining an operational status of the holding orifice from the light received by the imaging device.

In one embodiment, the method comprises determining that the holding orifice is blocked when less than a threshold amount of light is received by the imaging device.

In one embodiment, the method comprises determining that the holding orifice is blocked when less than a threshold area of light is received by the imaging device.

In one embodiment, the method comprises determining that the holding orifice is damaged when light shaped other than in a shape of the holding orifice is received by the imaging device.

In one embodiment, the method comprises sealing the conduit at the optical assembly to prevent fluid communication between the ambient atmosphere and the conduit via the optical assembly.

In one embodiment, the main body of the pick arm is elongate, having a major elongate axis, and a line passing through the alignment window and the holding orifice extends through the pick arm in a direction transverse to the major elongate axis.

In one embodiment, the conduit further comprises a through-hole at the holding orifice extending through the pick arm.

In one embodiment, the holding orifice is positioned on a first face of the pick arm proximate the semiconductor die, and the alignment window is positioned on an opposing second face of the pick arm.

In one embodiment, the conduit comprises a frusto-conical collet extending from the main body in the direction transverse to the major elongate axis, a minor annulus of the frusto-conical portion defining an orifice for exerting a vacuum suction force on the semiconductor die.

In one embodiment, the method comprises fluidly coupling the conduit with a vacuum device using a vacuum passage.

In one embodiment, the vacuum passage extends from a position intermediate the holding orifice and the alignment window.

In one embodiment, the conduit is at least partially embedded within the pick arm.

In one embodiment, the method comprises positioning a light source to transmit light through a surface on which the semiconductor die is configured to be mounted, towards the holding orifice.

In one embodiment, the method comprises dimensioning at least one of the main body and the frusto-conical collet to extend along said major elongate axis such as to impair light transmission from the light source to the imaging device other than via the holding orifice.

In one embodiment, the method comprises positioning the light source to illuminate an ejector body operable to lift the semiconductor die.

In one embodiment, the method comprises at least one of optically and co-axially aligning the light source with the holding orifice and the alignment window.

In one embodiment, the conduit is unobstructed to facilitate light being conveyed from the holding orifice to the alignment window.

In one embodiment, the vacuum conduit at least partially extends along the major elongate axis.

In one embodiment, the imaging device comprises a camera.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which:

FIGS. 4A to 4C show images received by the imaging plane; and

In the drawings, like parts are denoted by like reference numerals.

DETAILED DESCRIPTION

Before discussing the embodiments and more detail, first an overview will be provided. Embodiments provide an arm of a semiconductor pick and place apparatus which is configured to permit light to pass from a holding orifice of a conduit extending through the main body of the pick arm to be imaged by an imaging device so that its position can be accurately determined. The holding orifice needs to be accurately positioned to enable suction to be applied to a semiconductor die to hold the semiconductor die in place against the pick arm while being moved to a new location. In particular, light is projected from a surface or substrate on which a semiconductor die may be positioned, into the holding orifice and through the pick arm to be imaged by an imaging device. This enables the imaging device to determine the location of the holding orifice in relation to the imaging device, with the imaging device typically being aligned with the expected pick location of a semiconductor die to be picked by the pick and place apparatus. For example, if the imaging device is centered or coaxially aligned with the expected pick location of the semiconductor die and the image of the illuminated holding orifice is not also centered, then this means that the pick arm is not in the correct location to enable the holding orifice to align with the semiconductor die. Accordingly, the support for the semiconductor die is typically adjusted to center the illuminated holding orifice with a center of the semiconductor die. Alternatively, it will be appreciated that the position of the pick arm may be moved instead to center the illuminated holding orifice with a center of the semiconductor die. Hence, embodiments provide a one-piece bond arm with an embedded vacuum path, lens and collet which allow real-time collet hole inspection.

Pick Arm

Figure 1A:
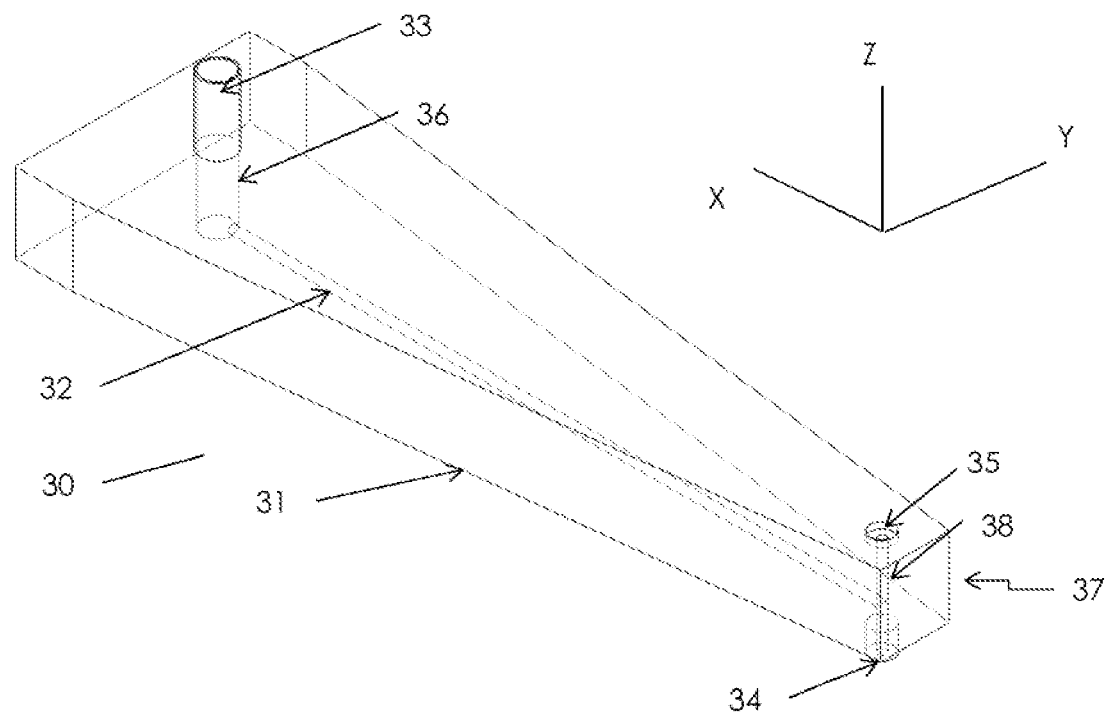
FIG. 1A is a perspective schematic view and FIG. 1B is a side view of a pick arm according to one embodiment.
Figure 1B:
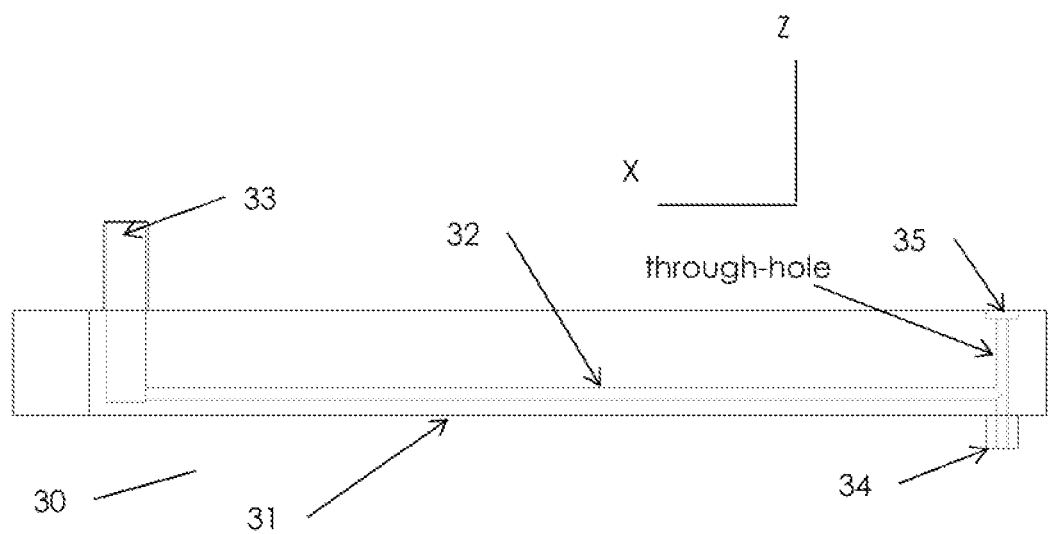

FIG. 1A is a perspective schematic view and FIG. 1B is a side view of a pick arm 30 according to one embodiment. The pick arm 30 has an arm body 31 which is elongate, extending along an elongate axis X. At a first end of the pick arm 30 is a vacuum tube coupler 36. Located at the other end of the pick arm 30 is a vacuum assembly 37. A vacuum channel 32 is embedded within the pick arm 30, extending along the X axis and fluidly couples the vacuum tube coupler 36 with the vacuum assembly 37. The vacuum assembly 37 comprises a collet 34 extending from the underside of the pick arm 30, an optical assembly such as a lens assembly 35 located on the upper surface of the pick arm 30 and a vacuum conduit 38. The collet 34, the lens assembly 35 and the vacuum conduit 38 are axially aligned along a Z axis, which extends transversely to the X axis from the underside to the upper surface of the pick arm 30. The vacuum channel 32 fluidly couples the vacuum tube coupler 36 with the vacuum conduit 38. As will be explained in more detail below, the support for the semiconductor die is coupled with an actuator (not shown) which is operable to move the support for the semiconductor die along the X and Y axes to align a semiconductor die with the pick arm 30.

In operation, a vacuum pump (not shown) coupled with a vacuum tube connector 33 generates a vacuum which draws ambient atmospheric gas through the collet 34, via the vacuum conduit 38, the vacuum channel 32, the vacuum tube coupler 36 and the vacuum tube connector 33. As will be explained in more detail below, the proximity of the collet 34 to a semiconductor die (not shown) causes the semiconductor die to be retained by the pressure differential between the inside of the collet 34 and external ambient pressure against the collet 34 for manipulation and movement by the pick arm 30.

Hence, it can be seen that pick arm assembly comprises a collet mount with a through-hole which allows light rays to pass through and view the orifice of the collet 34 (which may be by way of a collet hole and/or collet identifier). The collet 34 is mounted and embedded with a vacuum channel 32 inside the arm body 31 which has an optically transparent element on top of this through-hole to allow a camera device to detect the orifice and to isolate a vacuum inside for picking up the die, Such a transparent element may further help to collimate the light from the light source to the camera and is located at the die pick position during the collet inspection.

Pick and Place Apparatus

Figure 2:
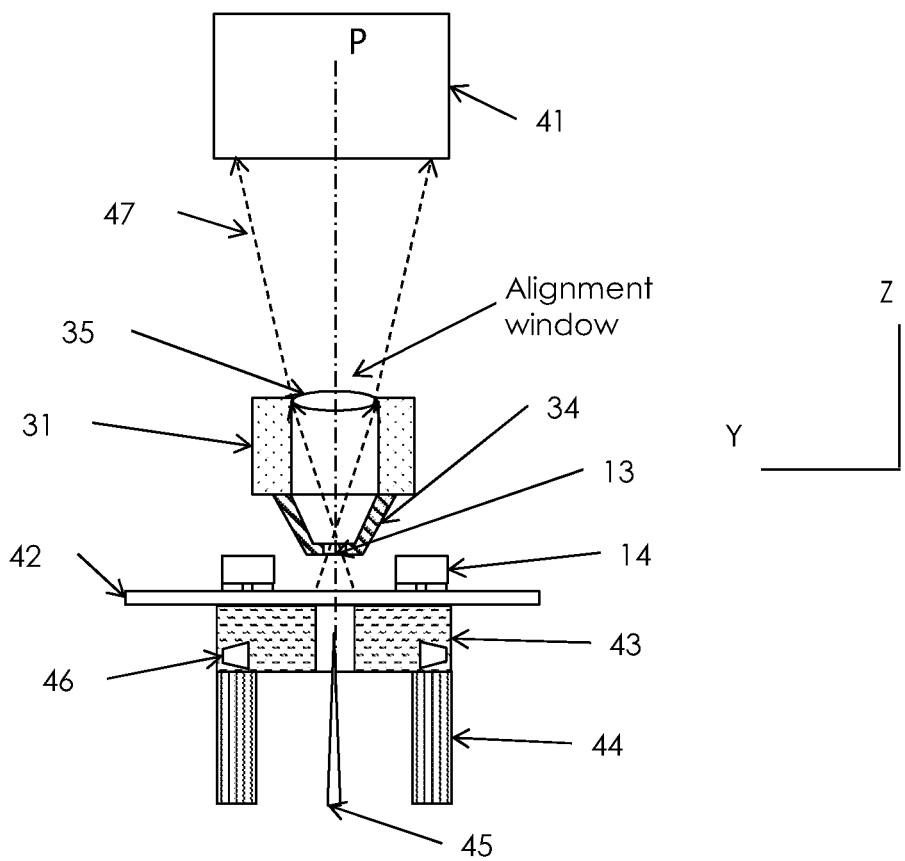
FIG. 2 illustrates a partial cross-section through the vacuum assembly together with other major components of the pick and place apparatus.

FIG. 2 illustrates a partial cross-section through the vacuum assembly 37 along the Y axis, together with other major components of the pick and place apparatus. As can be seen, the collet 34 is frustroconical in shape and extends from a lower surface of the arm body 31. The collet 34 has a holding orifice 13 which is defined in the smaller annular face of the collet 34. The upper surface of the arm body 31 retains a lens assembly 35. The collet 34, the lens assembly 35 and the vacuum conduit 38 are coaxially aligned along the Z axis.

An ejector body 44 is provided which has an ejector cap 43 which houses an ejector pin 45. A mount or holder, in this example a Mylar tape 42, retains a number of semiconductor dies, in this example LEDs 14. The Mylar tape 42 is retained by a positioning table (not shown) which is movable along the X, Y and typically Z axes independently with respect to the ejector body 44. This enables different LEDs 14 to be positioned at a pickup position P over the ejector pin 45. The ejector cap 43 is translucent and houses light sources 46. The light sources 46 operate to illuminate the ejector cap 43. As will be explained in more detail below, the holding orifice 13 is intended to be coaxially aligned at pickup position P with the ejector pin 45.

Hence, it can be seen that the ejector module has an ejector body 44 which integrates with an ejector pin 45. An ejector cap 43 is integrated on top of the ejector body 44 and has light emitting elements of one or more wavelengths. A light diffusion material or light transmittable material or a light guide helps to diffuse, reflect and collimate light 47 emitted from the light source 46 to a camera. The cap allows the light 47 emitted to be exposed to the orifice of the collet. Openings on the top surface of the ejector cap allow the ejector pin to move up and down to make contact with LEDs on the Mylar tape.

A camera device 41 is located above the ejector body 44 and the bond arm body 31, spaced away along the Z axis to provide a top-down view of the collet assembly and in particular of the orifice 13 of the collet. In this example, the centre of an imaging portion of the camera device 41 is positioned to be coaxially aligned with the centre of the ejector pin 45 at the pickup position P. However, it will be appreciated that the camera need not be centred on the pickup position P provided that the pickup position P can still be imaged by the imaging portion.

In operation, the Mylar tape 42 is manipulated in the X and Y direction by the positioning table to position an LED 14 above the ejector pin 45. The vacuum pump applies a vacuum to the vacuum tube connector 33, which causes a reduction in pressure at the holding orifice 13 which causes the LED 14 below the holding orifice 13 to be held by suction against the holding orifice 13. The ejector pin 45 translates along the Z axis to push the LED 14 from the Mylar tape 42 and the arm body 31 translates upwards along the Z axis to lift the LED 14 from the Mylar tape 42.

The pick arm 30 can then translate in the X, Y and Z directions to move the LED 14 to a new location for subsequent processing. The vacuum pump ceases to apply the vacuum via the vacuum tube connector 33, which releases the LED 14 from the holding orifice 13.

The positioning table translates the Mylar tape 42 to present another LED 14 to the pickup position P above the ejector pin 45 and the pick arm 30 is translated back to the pickup position P above the ejector pin 45 to pick up the next LED 14.

Positioning Compensation

Figure 3:
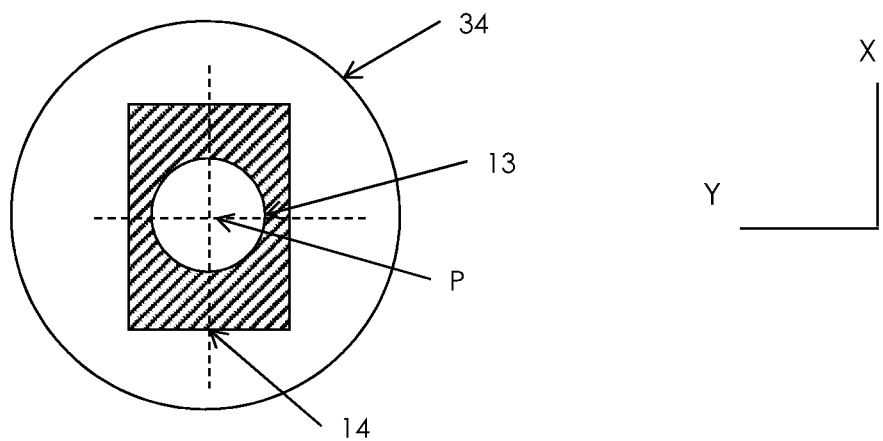
FIG. 3 illustrates the arrangement of the LED in relation to the collet at the pick position P and the size of the collet in relation to the LED.

As can be seen in FIG. 3, which illustrates the arrangement of the LED 14 in relation to the collet 34 at the pickup position P, the size of the collet 34 in relation to the LED 14 is such that precise alignment of the holding orifice 13 is required to ensure that it aligns correctly with the LED 14 at the pickup position P. However, rapid movement of the pick arm 30 at high transfer speeds for long hours may, for instance, cause the pick arm 30 to expand due to heat generation.

Typically, in overview, during the die pick cycle, the pickup location P is aligned with an empty site (i.e. there is no die at that location), the light elements are switched on, the collet 34 is at the pick position and level, the camera 41 takes a picture, a normal die pick and bond process resumes, the data gathered is analyzed, the xy position of the holding orifice 13 is corrected from time to time. To attain closed-loop feedback and compensate for any thermal position shift of the collet, an internal size of the holding orifice 13 is determined which gives a life time projection and detects blockage by foreign materials, and the collet orifice shape is further determined (which detects damage).

As mentioned above, the light sources 46 elements are installed inside the ejector cap 43. The holding orifice 13 position can be detected at the pick position P during die pick if the die is translucent or if an empty die position is used for detection. The detection can occur during production mode, so that the thermal condition is a real-time condition for the system to compensate for any positional shift (using feedback loop compensation). Additional inspections can also be done for blockage, damage and life diagnostics.

Accordingly, as shown in FIG. 2, in order to verify and correct the positioning of the holding orifice 13, the bond arm body 31 is located at the pickup position P above the ejector pin 45. The Mylar tape 42 is positioned so that no LED 14 is present at the pickup position P above the ejector pin 45. The light source elements 46 are activated to illuminate the ejector cap 43. The light emitted by the ejector cap 43 passes through the Mylar tape 42 and into the holding orifice 13. The light passes through the collet 34 and the vacuum conduit 38 to the lens assembly 35. The light exits the lens assembly 35 and is received by the imaging plane of the camera device 41.

As can be seen in FIG. 4A, which shows the image received by the imaging plane, the light received by the imaging device 41 is centered around a center of the image. The pickup location P may then be aligned to the holding orifice 13 so that the pickup location P is correctly located to enable the LED chip 14 to be lifted, as illustrated in FIG. 3.

FIG. 4B illustrates the image received by the camera device 41 after an extended period of processing and shows that the holding orifice 13 is still centered around a center of the image, but that the aperture of the holding orifice 13 has reduced through wear or through debris collection.

FIG. 4C illustrates the image received by the camera device 41 after a further extended period of processing and shows that the holding orifice 13 is now offset from a center of the image along the Y axis. Thus, the pickup location P and the ejector pin 45 will need a corresponding displacement along the Y-axis with respect to the pick arm in order to co-locate the holding orifice 14 with the LED 14 and the ejector pin 45 at the pickup location P. As can also be seen, the holding orifice 13 has reduced in diameter further, caused by damage to the collet 34 and/or the presence of debris in the vicinity of the holding orifice 13. Should the shape and/or area of the holding orifice imaged by the camera device 41 vary by greater than a threshold amount, then an alert such as an alarm may be activated signalling to an operator that replacement or servicing of the collet 34 is required.

Figure 5:
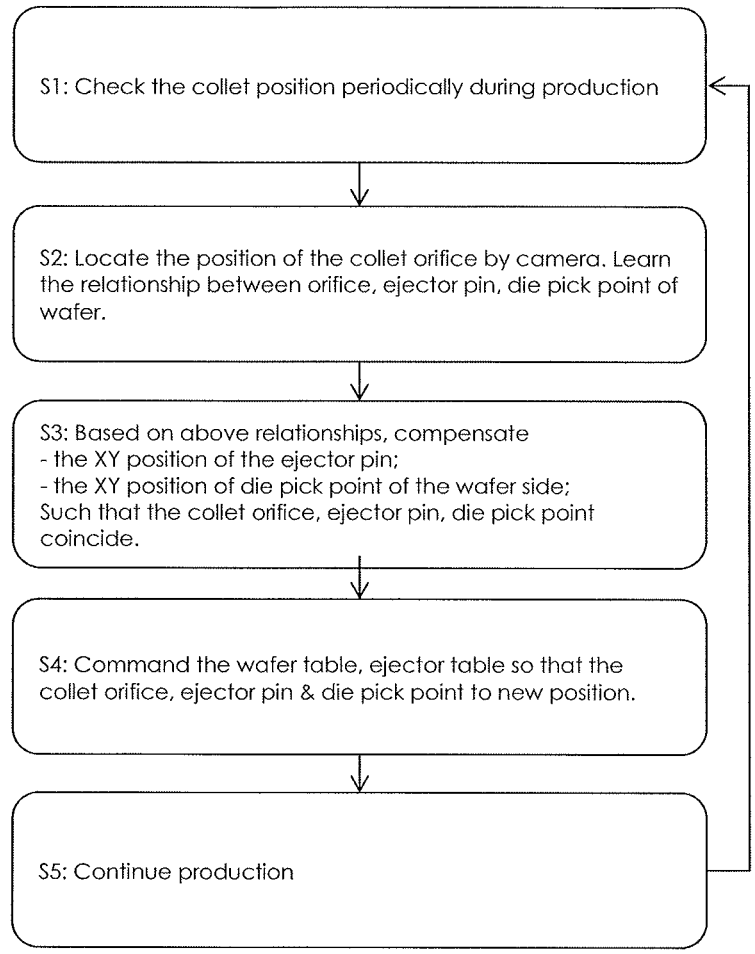
FIG. 5 describes the main processing steps performed when checking for the position of the holding orifice.

FIG. 5 describes the main processing steps performed when checking for the position of the holding orifice 13.

At step S1, the periodic checking of the position occurs during production. The periods between these checks may be based upon historic checks so as to prevent unnecessary checks from being performed while also minimizing the likelihood of an undetected defect occurring. Typically, the periods will be based on the number of pickup cycles performed.

When it is desired to perform a check, then processing proceeds to step S2 where the position of the holding orifice 13 is located using the imaging device 41. The positional relationship between the holding orifice 13, the ejector pin 45 and the pickup point P is determined. In particular, the positional deviation of the holding orifice 13 with respect to the pickup point P is determined and a positional correction is calculated. Processing then proceeds to step S3.

At step S3, the XY deviation of the ejector pin and the pickup point P can be compensated for by applying the positional correction such that the holding orifice 13, the ejector pin 45 and the pickup point P coincide. Processing then proceeds to step S4.

At step S4, the positioning table holding the Mylar tape 42 and/or the table holding the ejector body 44 are commanded to move to a new position such that the holding orifice 13, the ejector pin 45 and the pickup point P all coincide. Processing then proceeds to step S5.

At step S5, production may then continue until the next periodic check is required, whereupon processing returns to step S1.

Hence, it can be seen that embodiments provide a light source 46 installed inside the ejector module which is in a bottom-up manner while the camera device 41 is a top-down camera with the collet 34 situated at the pick level in between the two. During the inspection, light 47 passes through the orifice 13 of the collet 34, through the lens assembly 35 of the pick/bond arm and is finally captured by the camera device 41. The pick arm 30 is a one-piece assembly having an embedded vacuum path, a lens to allow collet orifice inspection and a collet. The ejector has embedded light source elements inside to provide a backlighting source. Real-time inspection and positional feedback of ejector table & pick position processing is provided during production.

This approach improves the mean time between remedial actions and results in less down-time for maintenance, and improves throughput and process performance. It also improves xy bonding accuracy against time and reduces collet consumption.

Although the present invention has been described in considerable detail with reference to certain embodiments, other embodiments are possible.

Therefore, the spirit and scope of the appended claims should not be limited to the description of the embodiments contained herein.

The invention claimed is:

1. A semiconductor pick and place apparatus, comprising:
   a pick arm comprising:
   an elongate main body having a first end and a second end opposite to the first end, and
   a conduit incorporated in the elongate main body for permitting fluid flow through the main body between the said first and second ends via the conduit, the conduit further defining:
   a holding orifice formed at the second end of the elongate main body on one side of the pick arm which is operative in use to secure a semiconductor die;
   a through-hole extending, at the second end of the elongate main body, from the holding orifice on the one side of the pick arm to an opposite side of the pick arm;
   the conduit being configured to convey light received from the one side of the pick arm through the holding orifice, and an alignment window on the main body that is formed by the through-hole on the opposite side of the pick arm, wherein the elongate main body is made of a material to shield light transmission from the one side of the pick arm to the opposite side of the pick arm other than via the holding orifice.

2. The semiconductor pick and place apparatus of claim 1, wherein the holding orifice and the alignment window are at least one of optically and co-axially aligned.

3. The semiconductor pick and place apparatus of claim 1, wherein the holding orifice and the alignment window are concentric.

4. The semiconductor pick and place apparatus of claim 1, wherein the holding orifice is open to fluidly couple the conduit with an ambient atmosphere via the holding orifice.

5. The semiconductor pick and place apparatus of claim 1, wherein the alignment window houses an optical assembly configured to project light received through the holding orifice onto an imaging device positioned on the said opposite side of the pick arm.

6. The semiconductor pick and place apparatus of claim 5, wherein the optical assembly seals the conduit at the optical assembly to prevent fluid communication between the ambient atmosphere and the conduit via the optical assembly.

7. The semiconductor pick and place apparatus of claim 1, wherein the holding orifice is positioned on a first face of the pick arm proximate the semiconductor die, and the alignment window is positioned on an opposing second face of the pick arm.

8. The semiconductor pick and place apparatus of claim 1, wherein the conduit is at least partially embedded within the pick arm.

9. The semiconductor pick and place apparatus of claim 1, wherein the main body of the pick arm has a major elongate axis, and a line passing through the alignment window and the holding orifice extends through the pick arm in a direction transverse to the major elongate axis.

10. The semiconductor pick and place apparatus of claim 9, wherein the conduit comprises a frusto-conical collet extending from the main body in the direction transverse to the major elongate axis, a minor annulus of the frusto-conical portion defining the holding orifice for exerting a vacuum suction force on the semiconductor die.

11. The semiconductor pick and place apparatus of claim 10, wherein at least one of the main body and the frusto-conical collet is dimensioned to extend along said major elongate axis such as to impair light transmission from the light source to the imaging device other than via the holding orifice.

12. The semiconductor pick and place apparatus of claim 1, wherein the conduit defines a vacuum passage which fluidly couples the conduit with a vacuum device.

13. The semiconductor pick and place apparatus of claim 12, wherein the vacuum passage extends from a position intermediate the holding orifice and the alignment window.

14. The semiconductor pick and place apparatus of claim 1, comprising a light source which is positioned to transmit light through a surface on which the semiconductor die is configured to be mounted, towards the holding orifice.

15. The semiconductor pick and place apparatus of claim 14, wherein the light source is at least one of optically and co-axially aligned with the holding orifice and the alignment window.

16. The semiconductor pick and place apparatus of claim 14, wherein the light source is positioned to illuminate an ejector body operable to lift the semiconductor die.

17. A semiconductor pick and place method, the method comprising:

providing a pick arm having an elongate main body having a first end and a second end opposite to the first end, and a conduit incorporated in the elongate main body for permitting fluid flow through the main body between the said first and second ends via the conduit, the conduit further defining a holding orifice formed at the second end of the elongate main body on one side of the pick arm which is operative in use to secure a semiconductor die, the pick arm further having a through-hole extending, at the second end of the elongate main body, from the holding orifice on the one side of the pick arm to an opposite side of the pick arm; and conveying light received from the one side of the pick arm through the holding orifice, and an alignment window on the main body that is formed by the through-hole on the opposite side of the pick arm, wherein the elongate main body is made of a material to shield light transmission from the one side of the pick arm to the opposite side of the pick arm other than via the holding orifice, for determining the position of the holding orifice.

18. The semiconductor pick and place method of claim 17, further comprising the step of correcting a position of the semiconductor die relative to the holding orifice such that the holding orifice, a die pick position and an ejector are aligned in a straight line.

19. The semiconductor pick and place method of claim 17, further comprising the step of inspecting a shape and/or area of the holding orifice, and activating an alert to an operator when the shape and/or area of the holding orifice exceeds a threshold amount.

\* \* \* \* \*